United States Patent [19]

Petri

[11] Patent Number: 5,739,431
[45] Date of Patent: Apr. 14, 1998

[54] MINIATURE MAGNETOMETER-ACCELEROMETER

[75] Inventor: Fred Petri, Snohomish, Wash.

[73] Assignee: AlliedSignal, Inc., Morristown, N.J.

[21] Appl. No.: 663,402

[22] Filed: Jun. 13, 1996

[51] Int. Cl.[6] .................. G01P 3/00; G01R 33/00; G01C 9/10
[52] U.S. Cl. .............. 73/509; 73/514.37; 73/504.04; 73/152.48; 73/152.59; 324/260; 33/365
[58] Field of Search .............. 73/514.37, 514.16, 73/514.01, 510, 509, 504.04, 862.59, 862.41, 504.12, 152.48, 152.59; 324/244, 246, 257, 260; 33/365

[56] References Cited

U.S. PATENT DOCUMENTS

| | | | |
|---|---|---|---|
| 4,215,570 | 8/1980 | EerNisse | 73/141 R |
| 4,321,500 | 3/1982 | Paros et al. | 310/321 |
| 4,372,173 | 2/1983 | EerNisse et al. | 73/862.59 |
| 4,384,495 | 5/1983 | Paros | 73/862.59 |
| 4,724,351 | 2/1988 | EerNisse et al. | 310/328 |
| 4,825,166 | 4/1989 | MacGugan | 324/346 |
| 4,896,268 | 1/1990 | MacGugan | 364/453 |
| 4,912,990 | 4/1990 | Norling | 73/862.59 |
| 5,005,413 | 4/1991 | Novack et al. | 73/517 AV |
| 5,241,861 | 9/1993 | Hulsing, II | 73/504.04 |
| 5,319,976 | 6/1994 | Hulsing, II | 73/505 |
| 5,331,853 | 7/1994 | Hulsing, II | 73/505 |
| 5,331,854 | 7/1994 | Hulsing, II | 73/505 |
| 5,341,682 | 8/1994 | Hulsing, II | 73/505 |
| 5,417,120 | 5/1995 | Hulsing, II | 73/862.59 |
| 5,456,110 | 10/1995 | Hulsing, II | 73/514.38 |
| 5,557,046 | 9/1996 | Hulsing, II | 73/504.04 |

*Primary Examiner*—Hezron E. Williams
*Assistant Examiner*—Richard A. Moller

[57] ABSTRACT

A magnetometer is integrated with a miniature vibrating beam accelerometer fabricated out of silicon on a common substrate. Dual pendulum-DETF force sensing accelerometers have integrated conductor coils on the pendulums that circulate alternating current to cause an additional pendulum motion also sensed by the DETF transducers for sensing local earth magnetic field. The integrated magnetic and acceleration sensing is used for each of three reference axes in a triaxial inclinometer magnetometer for borehole drill steering and surveying.

14 Claims, 4 Drawing Sheets

$$\Sigma_{12,14} = \Delta f_{n_{12}} + \Delta f_{n_{14}} + L_{ACCEL_{12}} - L_{ACCEL_{14}} = \Delta f_{n_{12,14}}$$

$$\Delta_{12,14} = \Delta f_{n_{12}} - \Delta f_{n_{14}} + L_{ACCEL_{12}} + L_{ACCEL_{14}} = L_{ACCEL_{12,14}}$$

*Fig. 3*
(PRIOR ART)

MINIATURE MAGNETOMETER-ACCELEROMETER

FIELD OF THE INVENTION

The present invention relates to the field of magnetometers and accelerometers, and more particularly to instruments used for borehole drilling and surveying.

BACKGROUND OF THE INVENTION

The use of silicon manufacturing technology has allowed development of various types of miniature low cost accelerometers. One type that has been developed is based on vibrating beam accelerometers (VBA) and uses a double ended tuning fork (DETF) transducer combined with a pendulum such as a hinged proof mass allowed to rotate about the hinge and transmit acceleration responsive force to the DETF. An accelerometer of this type may be adapted for use as an inclinometer that determines angular inclination with respect to the earth's surface, angular direction relative to earth gravity. In borehole drilling and surveying, the inclinometer is usually augmented with a separate magnetometer that locates the azimuth of the earth's local magnetic field. Such instruments have numerous applications including the steering of drill strings in boreholes and charting the location of existing boreholes. In the past it has usually been necessary to provide separate instruments, namely triaxial accelerometers for inclination and magnetometers for azimuth to yield all the required orientation data. These instruments, especially the magnetometers, are often mounted in the drill string adjacent the bit, and determine the borehole path in terms of inclination, azimuth and tool face angles. In some cases, the accelerometers have full gyrocompass capability to give a reference azimuth of true north for correcting the magnetometer reading due to local magnetic abnormalities.

SUMMARY OF THE INVENTION

In summary the present invention integrates a magnetometer into a miniature vibrating beam accelerometer. The preferred embodiment is fabricated out of silicon or other material on a common substrate that combines dual pendulum-DETF force sensing accelerometers and integrated conductors on the pendulums that circulate alternating current to cause an additional pendulum motion also sensed by the DETF transducers to measure local magnetic field. The integrated magnetic and acceleration sensing is in the preferred embodiment used for each of three reference axes. Thus only three sensing devices are required for a triaxial inclinometer magnetometer covering an x, y, z orthogonal coordinate system.

BRIEF DESCRIPTION OF THE DRAWINGS

FIG. 3 is a functional block diagram of the summation and differencing of output signals to yield sensed magnetic field and linear acceleration, respectively from the output signal of FIG. 2.

DETAILED DESCRIPTION OF PREFERRED EMBODIMENTS

Figure 1:
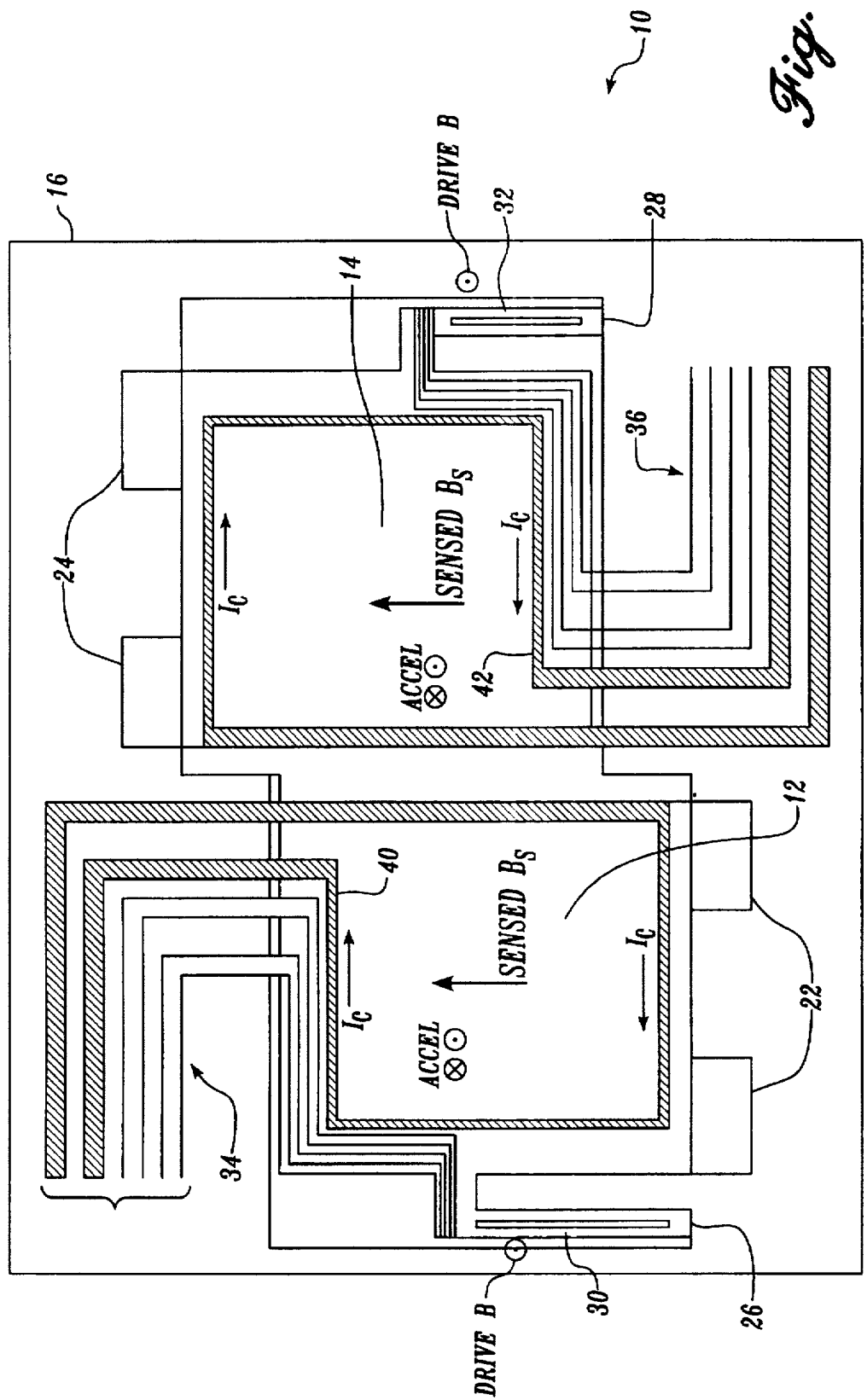
FIG. 1 is a top plan view of an integrated dual pendulum-coil accelerometer magnetometer in accordance with the preferred embodiment.

The preferred embodiment of the magnetometer-accelerometer 10 suitable for borehole bit steering and surveying is shown in FIG. 1 to include accelerometer sensing for inclination by dual pendulums 12, 14 micromachined on a common chip substrate 16 and having limited pendulum rotation about relatively thin epitaxial (epi) layer hinges 22, 24 located in a plane of one substrate surface. This basic type of dual pendulum vibrating beam accelerometer is taught in Hulsing U.S. Pat. No. 5,456,110. The pendulums each have a relatively thin paddle-shaped body mass. Each of pendulums 12, 14 has an associated force transducer in the form of an epi-layer double ended tuning fork (DETF) 26, 28 fabricated from the substrate so as to be attached to the respective pendulum along its side at a predetermined distance from hinges 22 and 24. In this embodiment, DETF 26, 28 are of the type driven into resonant vibration by the Lorentz force of a permanent magnet flux field B interacting with current I (BxI) resulting from an ac current $I_d$ of frequency $f_d$ in the tuning fork legs. The permanent magnetic drive field (Drive B) is at right angle to the ac current flow I. Each DETF 26, 28 is thus driven and sensed through a metallic conducting layer 30, 32 deposited on a surface of the DETF legs.

Conductive leads to layers 30, 32 make a path from the body mass of the corresponding pendulum 12, 14 along epi-layer struts at 34, 36 located near the longitudinal extent of the pendulums opposite hinges 22, 24 in the same plane as the DETF epi-layer.

Integrated into the accelerometer micromachined chip wafer structure are conductive metallic legs or coil 40, 42 formed by gold or other suitable material on the pendulum paddle masses and driven with ac current $I_c$ to produce forces on the coils 40, 42 and hence on supporting pendulums 12, 14 proportional to a magnetic field, $B_s$ to be sensed. The sensed field $B_s$ may be the earth's local magnetic field in the boreholes. The sensed field direction of $B_s$ is along the pendulum body axis, i.e., the axis that is perpendicular to the hinge and in the plane of the pendulum body mass. The conductive legs of each of the magneometer coil 40, 42 that are orthogonal to the sensed B field and are adjacent opposite longitudinal extents produce opposite vibration forces on the pendulum body. The leg adjacent the hinged edge of the pendulum, and another leg near the opposite or unhinged edge of the pendulum react to the Lorentz forges to push the pendulum in opposed directions because of the opposite direction of current I as seen by the sensed B field. An oscillating (ac) current $I_c$ of frequency $f_o$ is conducted through the circuit loop to interact with the sensed magnetic field $B_s$, creating an alternating moment which produces a dither or oscillating force on the pendulum and hence on the associated DETF at about the same ac frequency force $f_o$. The oscillating force will vary the output of the DETF transducer at the oscillating frequency $f_o$ of the current $I_c$. Selecting an oscillating frequency $f_o$ of the sensing current I that is different and preferably lower compared to the accelerometer drive frequency $f_d$ of the DETF enables output signal processing to isolate the frequency change about $f_o$ which is then demodulated to measure the force produced by the sensed magnetic field $B_s$.

With dual pendulums configured as shown, linear acceleration produces opposite force reactions in the DETFs 26, 28. Summation of the phase opposed ac signals resulting from linear acceleration cancels the effect of linear acceleration and leaves the ac dither signal of frequency $f_o$, the demodulated amplitude of which is proportional to the sensed magnetic field $B_s$.

Conversely, subtracting the output of the DETFs 26, 28 removes the signal due to the sensed magnetic field $B_s$, leaving the sensed linear acceleration.

In a borehole steering and survey instrument, in which triaxial measurement of inclination and local magnetic azimuth are desired, three sets or modules of the above dual pendulum, and $B_s$ field coil sensors are packaged into a down hole triaxial instrument. The instrument may be incorporated into the drill string, or used separately for surveying existing boreholes. Alternatively, one or two acceleration and magnetic axes may be sensed by one or two dual pendulum-coil structures. In borehole drilling and surveying it is sometimes desirable to use a biaxial inclinometer and in those applications two dual pendulum coil devices incorporating the invention may be effectively employed.

The force produced by the magnetic field lying in the plane of the pendulum paddle is proportional to:

$$F = K \times B_s \times I_c$$

where $B_s$ is the sensed magnetic field flux, such as the local earth field; $I_c$ is the current through the coil or loop; and K is a scale constant. For typical dimensions of VBA sensors, 10 ma of current I would be the equivalent of 1 nano-g of force per nT of magnetic field flux, while 100 ma would produce 10 nano-g's of force per nT of flux. Thus, typical resolution of the accelerometer is on the order of 1 µg, and therefore the detection level is in the range of between 1000 and 100 nT for those current levels.

The body mass of each pendulum 12, 14 in the above device will resonate at its fundamental or natural frequency and that frequency can be used to drive the magnetometer to enhance sensitivity. In such case, typical Q's of 100–500 are easily achieved, and the fundamental frequency fn can be chosen to avoid low resonance accelerometer spurious signals. A sensing alternating current applied to the conductor on the body mass of pendulum for moving the pendulum in reaction to a sensed magnetic field in the plane pendulum excites a vibrating movement of the body mass of the pendulum that changes in vibration frequency in reaction to the sensed magnetic field. The sensing alternating current may be selected to be substantially at the resonant frequency $f_n$ of the pendulum. An example in this embodiment is to fabricate the pendulum to have a fundamental frequency of fn=2500 Hz. A device configured and operated at pendulum resonance is capable of resolving magnetic fields in the range of 1 nT.

Figure 2:
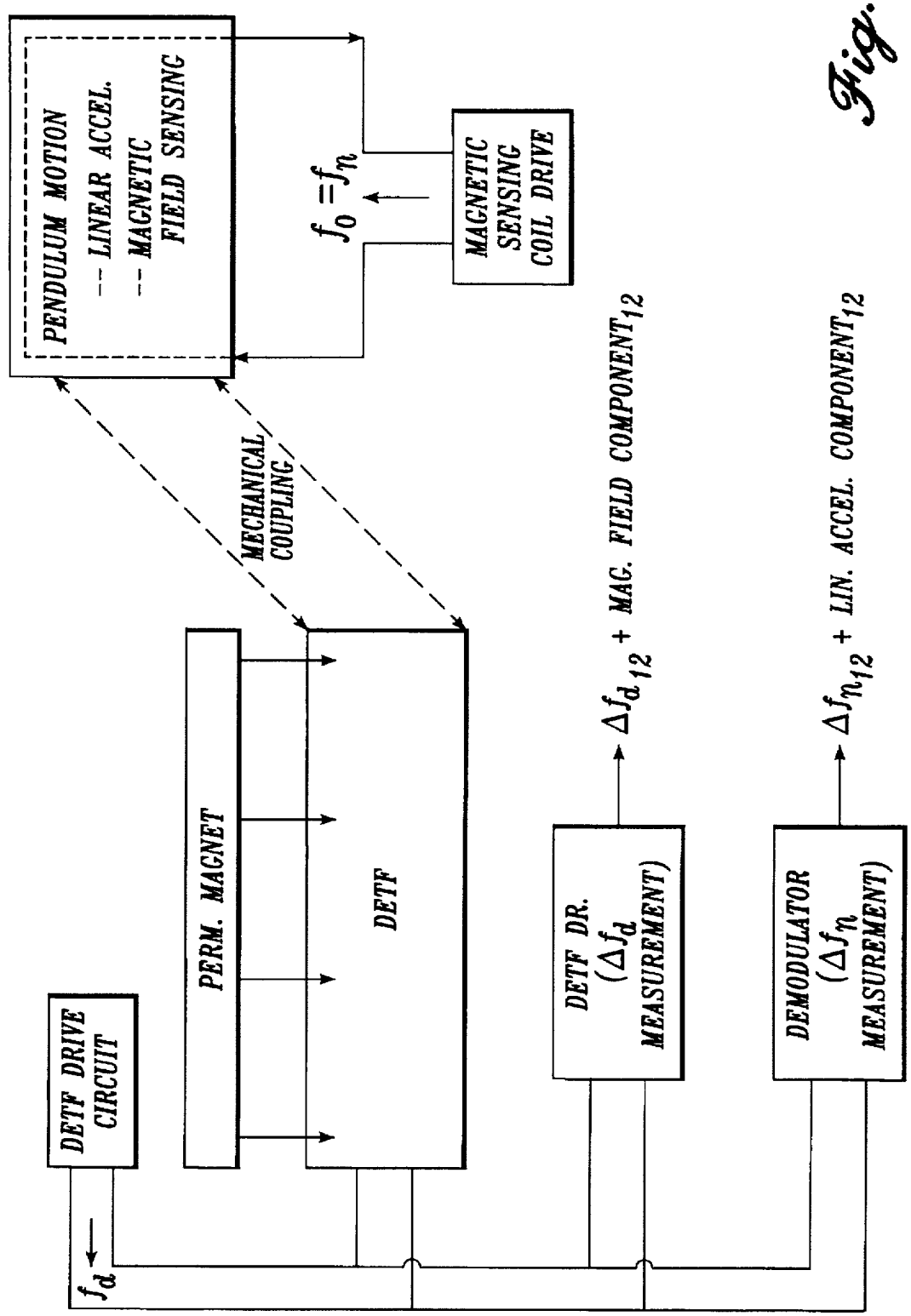
FIG. 2 is the functional block diagram of drive signal and output signal processing for one of the pendulum-coil structures of the device of FIG. 1.

The electronic circuitry to drive and sense the resonator is shown in the block diagrams of FIG. 2 and FIG. 3, and uses conventional electronic circuitry and signal processing.

ALTERNATE EMBODIMENT

Figure 4:
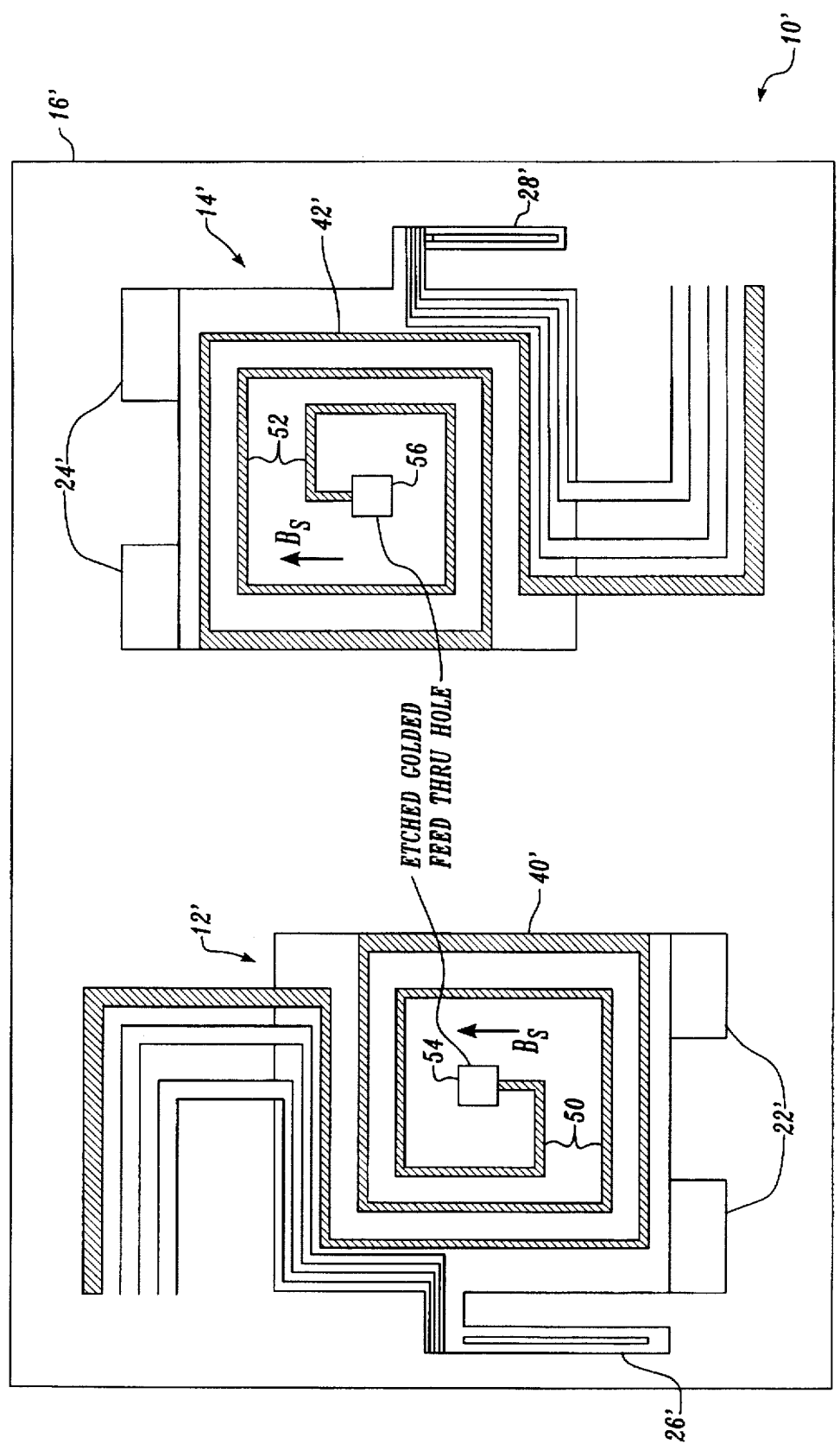
FIG. 4 is a top plan view of an alternative embodiment of the integrated dual pendulum-coil accelerometer magnetometer of FIG. 1.

Another configuration of the invention is an integrated magnetometer-accelerometer 10' that has multiple loop coils 40', 42' as shown in FIG. 4. Multiple loop coils increase sensitivity without requiring circuitry for driving the pendulum's body into resonance. In one configuration an inwardly spiraling gold conductor coil path 50, 52 ends at a gold coated center pad 54, 56 which provides a path to the opposite side of the pendulum paddle. There, connective leads (not shown) may be run out to the chip frame by way of the epi-layer hinges 22', 24'. Alternatively insulating silicon oxide SiO2 may be deposited along a path over the incoming gold coil leads and then a return path of gold leads may be deposited on top of the SiO2 insulator, in order to allow the return path to remain on the same side of the pendulum mass as the coil and incoming lead.

Another alternative embodiment (not shown) may provide chip structure for driving the DETFs using a capacitive coupling scheme rather than a permanent magnetic field as in the above embodiments. This would have an advantage in certain applications by eliminating any magnetic bias due to the presence of a permanent magnets but may place a limit on the upper operating temperature because capacitive drives are less tolerant to high temperatures found in bore hole drilling.

Still another embodiment may combine the accelerometer magnetometer with an angular rate sensor by dithering the dual pendulums toword and away from each other in the plane of the paddles inaccordance with the teaching of Hulsing in U.S. Pat. No. 5,331,853.

While only particular embodiments have been disclosed herein it will be apparent to persons skilled in the art that numerous changes and modifications can be made thereto, including the use of equivalent means, devices, and method steps without departing from the spirit of the invention.

I claim:

1. An integrated magnetometer and accelerometer device, comprising:

a pendulum mounted to move in response to an acceleration of the device;

a conductor attached to said pendulum for conducting an ac current so as to move said pendulum in reaction to a magnetic field that is to be sensed; and a transducer for producing output signals representing combined acceleration and magnetic field movement of said pendulum;

drive means for driving said transducer; and signal processing means for processing said output signals.

2. An integrated magnetometer and accelerometer device of claim 1, wherein the pendulum comprises a hinged mass in the shape of a paddle micromachined on a substrate, and said conductor comprises at least one loop on said hinged mass.

3. An integrated magnetometer and accelerometer device of claim 2, wherein said transducer is mounted on said substrate for producing said output signals in response to rotational movement of said hinged mass.

4. An integrated magnetometer and the accelerometer device of claim 1 wherein said pendulum and transducer are micromachined from a substrate that serves as a reference structure relative to which said pendulum moves in response to acceleration and interaction of said ac current in said conductor with a sensed magnetic field.

5. An integrated magnetometer and accelerometer, device of claim 1, wherein said pendulum is a paddle shaped hinged mass micromachined from a substrate that serves as a reference structure for detecting relative movement of the pendulum, and said transducer comprises a force sensing double-ended tuning fork also micromachined from said substrate and connected between said paddle shaped mass and the substrate reference structure, and wherein said conductor comprises at least one loop of conductive metal deposited on said paddle shaped mass and having conductive struts extending across a gap in said substrate between said mass and said reference structure.

6. An integrated magnetometer and accelerometer device of claim 5, wherein said double-ended tuning fork includes electrically conductive components to which a drive alternating current signal is applied for interacting with a permanent magnet field, said double-ended tuning fork transducer producing a first output signal in response to movement of said mass due to acceleration of the device, and a sensing alternating current applied to said conductor on said mass for moving said pendulum in reaction to a sensed magnetic field in the plane of said pendulum excites a vibrating movement of said mass that changes in vibration frequency in reaction to the sensed magnetic field and said double-ended tuning fork transducer produces a second output signal representing the sensed magnetic field.

7. An integrated magnetometer and accelerometer device of claim 6 wherein said sensing alternating current is selected to be substantially at the resonant frequency $f_n$ of said pendulum.

8. A borehole device for use in determining the heading and position of downhole equipment comprising:

(a) accelerometer means including a pendulum responsive to acceleration to cause a first movement of the pendulum for generating an output signal relating the orientation of the device to true vertical;

(b) magnetometer means integrated with said accelerometer means for generating an output signal relating azimuth of the device to a magnetic North reference including a current conducting coil supported by said pendulum for interacting with local earth magnetic field to cause a second movement of the pendulum;

(c) transducer means for converting the first and second movements of said pendulum into output signals; and (d) signal processing means for determining inclination and magnetic azimuth of the device in response to the output signals from said transducer means.

9. A borehole device of claim 8 wherein said pendulum, transducer means and coil are fabricated on a micromachined silicon substrate in which the pendulum is hinged to the substrate by an epitaxial layer.

10. An integrated magnetometer and inclinometer, comprising a plurality of detection modules, one for each of a plurality of axes, each module comprising:

a pendulum mounted to respond to acceleration along one of the axes that is to be sensed;

a conductor attached to the pendulum and drive circuit means for causing a current to flow in said conductor for interacting with a local earth magnetic field along one of the axes that is to be sensed for imparting movement to the pendulum in reaction to the strength and direction of local earth magnetic field;

a force to electrical signal transducer for producing an output representing combined acceleration and earth magnetic field measurements along the associated axes in reaction to movement of said pendulum; and a sisal processor for processing said output of said transducer.

11. An integrated magnetometer and inclinometer module of claim 10, wherein said pendulum and transducer include parts that are micromachined from a common substrate.

12. An integrated magnetometer and inclinometer device of claim 11, wherein said substrate is silicon.

13. An integrated magnetometer and inclinometer device of claim 11, wherein said conductor comprises a region of conductive metal on a portion of said substrate that forms said pendulum.

14. An integrated magnetometer and inclinometer device of claim 13, wherein connector leads to said conductive metal are formed on epitaxial struts that flexibly extend between said substrate and said pendulum.

* * * * *

UNITED STATES PATENT AND TRADEMARK OFFICE
CERTIFICATE OF CORRECTION

PATENT NO. : 5,739,431

DATED : April 14, 1998

INVENTOR(S) : Petri, Fred

It is certified that error appears in the above-identified patent and that said Letters Patent is hereby corrected as shown below:

Column 2, line 32: delete [coil] and substitute therefor --coils--.

Column 2, line 46: delete [forges] and substitute therefor --forces--.

Column 2, line 53 after "frequency" delete [force].

Column 4, line 8: delete [magnets] and substitute therefor --magnetic field--.

Column 4, line 15: delete [inaccordance] and substitute therefor --in accordance--.

Claim 5, line 1 (column 4, line 51): after "accelerometer" delete [,].

Claim 10, line 16 (column 6, line 18): delete "sisal" and substitute therefor --signal--.

Signed and Sealed this

Eleventh Day of August 1998

Attest:

BRUCE LEHMAN

*Attesting Officer*      *Commissioner of Patents and Trademarks*